United States Patent
Fang et al.

(10) Patent No.: US 11,695,272 B1
(45) Date of Patent: Jul. 4, 2023

(54) SURGE PROTECTION APPARATUS

(71) Applicant: Halo Microelectronics International, Campbell, CA (US)

(72) Inventors: Zhao Fang, Plano, TX (US); Wenchao Qu, Plano, TX (US); Gangqiang Zhang, Plano, TX (US)

(73) Assignee: Halo Microelectronics International, Campbell, CA (US)

( * ) Notice: Subject to any disclaimer, the term of this patent is extended or adjusted under 35 U.S.C. 154(b) by 0 days.

(21) Appl. No.: 17/646,666

(22) Filed: Dec. 30, 2021

(51) Int. Cl.
    *H02H 9/04* (2006.01)
    *H02H 9/00* (2006.01)

(52) U.S. Cl.
    CPC .............. *H02H 9/04* (2013.01); *H02H 9/005* (2013.01)

(58) Field of Classification Search
    CPC .. H02H 9/04; H02H 9/00; H02H 9/02; H02H 9/046; H02H 9/005; H02H 9/043; H01L 27/0266; H01L 27/02; H01L 27/0248; H01L 27/0255
    USPC .......................................................... 361/56
    See application file for complete search history.

(56) References Cited

U.S. PATENT DOCUMENTS

| | | | | |
|---|---|---|---|---|
| 7,848,069 B2* | 12/2010 | Ootsuka | ................ | H02H 9/046 361/111 |
| 2008/0062595 A1* | 3/2008 | Ping | ...................... | H02H 9/046 361/56 |
| 2008/0198518 A1* | 8/2008 | Choi | ...................... | H02H 9/046 361/56 |
| 2009/0067106 A1* | 3/2009 | Kim | ...................... | H02H 9/046 361/56 |
| 2015/0002965 A1* | 1/2015 | Hayashi | ............. | H01L 27/0266 361/56 |
| 2017/0163032 A1* | 6/2017 | Dai | ..................... | H01L 27/0248 |

\* cited by examiner

*Primary Examiner* — Danny Nguyen
(74) *Attorney, Agent, or Firm* — Li Li; AP3 Law Firm PLLC

(57) ABSTRACT

An apparatus includes a first diode and a second diode connected in series between a first voltage terminal and a second voltage terminal, a switch connected between the first voltage terminal and the second voltage terminal, and a clamping threshold circuit connected between a common node of the first diode and the second diode, and a gate of the switch, wherein the clamping threshold circuit is configured such that in response to a voltage surge applied to the common node of the first diode and the second diode, the switch is turned on once the voltage surge is greater than a predetermined threshold.

16 Claims, 11 Drawing Sheets

SURGE PROTECTION APPARATUS

TECHNICAL FIELD

The present invention relates to a clamping threshold circuit, and, in particular embodiments, to a clamping threshold circuit for a surge protection apparatus.

BACKGROUND

As technologies further advance, a variety of computing devices such as laptops, mobile phones, tablet PCs, digital cameras, MP3 players and/or the like, have become popular. Surge protection circuits are widely used in the port protection of the variety of computing devices. For example, surge protection on data lines is often required in a computing device with a plurality of input/output ports such as USB ports, Ethernet ports and the like. Traditional surge protection schemes often use an independent transient voltage suppressor (TVS) connected between a signal terminal (SIG) to be protected, and a ground terminal (GND).

FIG. 1 illustrates a surge protection circuit. As shown in FIG. 1, an integrated circuit has a SIG terminal and a GND terminal. In order to protect the SIG terminal and the circuits connected to it from being damaged by a voltage surge, a TVS T1 is connected between the SIG terminal and the GND terminal as shown in FIG. 1. In operation, when the SIG terminal receives a voltage surge exceeding the clamping threshold voltage of T1, T1 enters into a reverse avalanche breakdown mode to clamp the voltage on the SIG terminal.

In operation, when the reverse bias voltage of T1 exceeds the reverse breakdown voltage of T1, the reverse current flowing through T1 increases rapidly, thereby clamping the voltage on the SIG terminal. In order to clamp the voltage on the SIG terminal, T1 has a larger current flow capacity than ordinary diodes. The PN junction area of T1 is larger, and the parasitic capacitance of T1 is much higher than that of an ordinary diode.

In order to effectively protect a signal port with a relatively high bandwidth, a surge protection circuit should provide a constant and controllable clamping voltage, a widest possible signal bandwidth and a smallest possible board area. However, for the traditional TVS solution shown in FIG. 1, it is hard to achieve these three features. First, when the reverse bias voltage of T1 is greater than the clamping threshold voltage, the dynamic resistance (the ratio of the reverse voltage to the reverse current) of T1 increases significantly. The increased dynamic resistance causes the voltage across T1 to increase significantly. As a result, the voltage on the SIG terminal may reach a level exceeding the clamping threshold voltage. Second, in order to clamp the voltage on the SIG terminal, T1 needs a larger current flow capacity. In response to such a larger current flow capacity, the parasitic capacitance of T1 is relatively large even when T1 is reverse biased. As shown in FIG. 1, the parasitic capacitance of T1 is connected across the SIG terminal and the GND terminal. A low-pass filter is formed by the parasitic capacitance of T1. The larger parasitic capacitance of T1 has a significant impact on the signal bandwidth on the SIG terminal. As such, T1 shown in FIG. 1 is not suitable for higher bandwidth applications such as USB or Ethernet. Third, the discrete TVS device such as T1 occupies a larger board area than their integrated solution counterparts. T1 shown in FIG. 1 is not a good solution for achieving a high level of system integration and miniaturization.

FIG. 2 illustrates an active surge protection circuit. As shown in FIG. 2, the active surge protection circuit comprises a switch Q1 and a clamping threshold circuit connected between the SIG terminal and the GND terminal. The clamping threshold circuit comprise a plurality of Zener diodes $Z_1, Z_2, \ldots, Z_n$, and a resistor R1 connected in series between the SIG terminal and the GND terminal. R1 functions as a bias resistor. As shown in FIG. 2, R1 is connected between the gate of the switch Q1 and the GND terminal. The plurality of Zener diodes $Z_1, Z_2, \ldots, Z_n$ is connected in series between the SIG terminal and the gate of the switch Q1. The plurality of Zener diodes $Z_1, Z_2, \ldots, Z_n$ is used to set the clamping voltage of the active surge protection circuit. In particular, when the voltage on the SIG terminal exceeds the reverse breakdown voltage of the plurality of Zener diodes $Z_1, Z_2, \ldots, Z_n$, a current flows through R1. In response to this current, the switch Q1 is turned on, and the surge current passes through the switch Q1 to clamp the voltage on the SIG terminal. When the surge voltage increases, the current flowing through R1 increases. The increased current flowing through R1 increases the gate voltage of Q1, thereby reducing the on-resistance of Q1. The reduced on-resistance of Q1 helps to better clamp the voltage across its drain and source terminals of Q1.

The active surge protection circuit shown in FIG. 2 is able to realize the basic stability and controllability of the clamp voltage by including the switch Q1. However, the active surge protection circuit shown in FIG. 2 has obvious shortcomings in terms of bandwidth. As shown in FIG. 2, the drain and source of Q1 are directly connected to the SIG terminal and the GND terminal, respectively. As a result, the parasitic capacitance Cgs between the gate and the source of the switch Q1 and the parasitic capacitance Cgd between the gate and drain of the switch Q1 are also connected in series between the SIG terminal and the GND terminal. When the surge voltage does not occur, the switch Q1 remains off, and the parasitic capacitance value of Q1 is at the maximum value. As shown in FIG. 2, Cgs and Cgd are connected in series between the SIG terminal and the GND terminal to form a low-pass filter. In many applications, the switch Q1 needs to have a strong overcurrent capability. As such, the parasitic capacitance of Q1 is relatively large. The parasitic capacitance of Q1 has a significant impact on the bandwidth of the SIG terminal. In addition, if the signal amplitude at the SIG terminal is higher than the threshold voltage of Q1, the capacitive voltage division through Cgd and Cgs is sufficient to turn on Q1 to a certain extent. Once Q1 is turned on, it will cause signal distortion.

FIG. 3 illustrates another active surge protection circuit. As shown in FIG. 3, clamping diodes D1 and D2 are connected in series between a bias voltage terminal VDD and the GND terminal. The common node of D1 and D2 is connected to the SIG terminal. The Zener diodes $Z_1, Z_2, \ldots, Z_n$, and R1 are connected in series between the bias voltage terminal VDD and the GND terminal. A common node of the Zener diodes and R1 is connected to the gate of Q1.

In operation, when the voltage surge does not occur, the two clamping diodes D1 and D2 are reverse biased. The parasitic capacitance of Q1 is not connected to the SIG terminal. Only the parasitic capacitances of D1 and D2 are connected to the SIG terminal. The parasitic capacitances of D1 and D2 are much smaller than the parasitic capacitance of Q1. When a surge voltage occurs on the SIG terminal, and the voltage on the SIG terminal minus the diode voltage drop of D1 is greater than the threshold voltage of the active surge protection circuit, Q1 is turned on to clamp the voltage on the SIG terminal.

The introduction of the clamping diode D1 helps to isolate the parasitic capacitance of Q1. However, when the forward conduction current flowing through the diode D1 is greater than the peak pulse current of D1, the dynamic resistance of D1 will increase significantly. As a result, the voltage drop across D1 increases significantly with the increase of the forward conduction current. Thus, the active surge protection circuit shown in FIG. 3 can no longer clamp the voltage on the SIG terminal to the clamping voltage determined by the clamping threshold circuit.

The three known solutions discussed above all show some drawbacks. It would be desirable to have a simple and reliable surge protection solution to effectively protect integrated circuits from being damaged under voltage surges. The present disclosure addresses this need.

SUMMARY

These and other problems are generally solved or circumvented, and technical advantages are generally achieved, by preferred embodiments of the present disclosure which provide a clamping threshold circuit for a surge protection apparatus.

In accordance with an embodiment, an apparatus comprises a first diode and a second diode connected in series between a first voltage terminal and a second voltage terminal, a switch connected between the first voltage terminal and the second voltage terminal, and a clamping threshold circuit connected between a common node of the first diode and the second diode, and a gate of the switch, wherein the clamping threshold circuit is configured such that in response to a voltage surge applied to the common node of the first diode and the second diode, the switch is turned on once the voltage surge is greater than a predetermined threshold.

In accordance with another embodiment, a device comprises a first semiconductor element and a second semiconductor element connected in series between a first voltage terminal and a second voltage terminal, a first switch connected between the first voltage terminal and the second voltage terminal, and a clamping threshold circuit connected between a common node of the first semiconductor element and the second semiconductor element, and a control terminal of the first switch, wherein the clamping threshold circuit is configured such that the first switch is turned on once a voltage on the common node of the first semiconductor element and the second semiconductor element exceeds a predetermined threshold.

In accordance with yet another embodiment, a system comprises an integrated circuit having a plurality of terminals to be protected, a plurality of diodes, each of which has an anode connected to a corresponding terminal of the plurality of terminals to be protected, and a surge protection apparatus coupled between a first voltage terminal and a second voltage terminal, wherein cathodes of the plurality of diodes are connected together and further connected to an input of the surge protection apparatus.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a clamping threshold circuit for a surge protection apparatus. The invention may also be applied, however, to a variety of semiconductor circuits. Hereinafter, various embodiments will be explained in detail with reference to the accompanying drawings.

Figure 4:
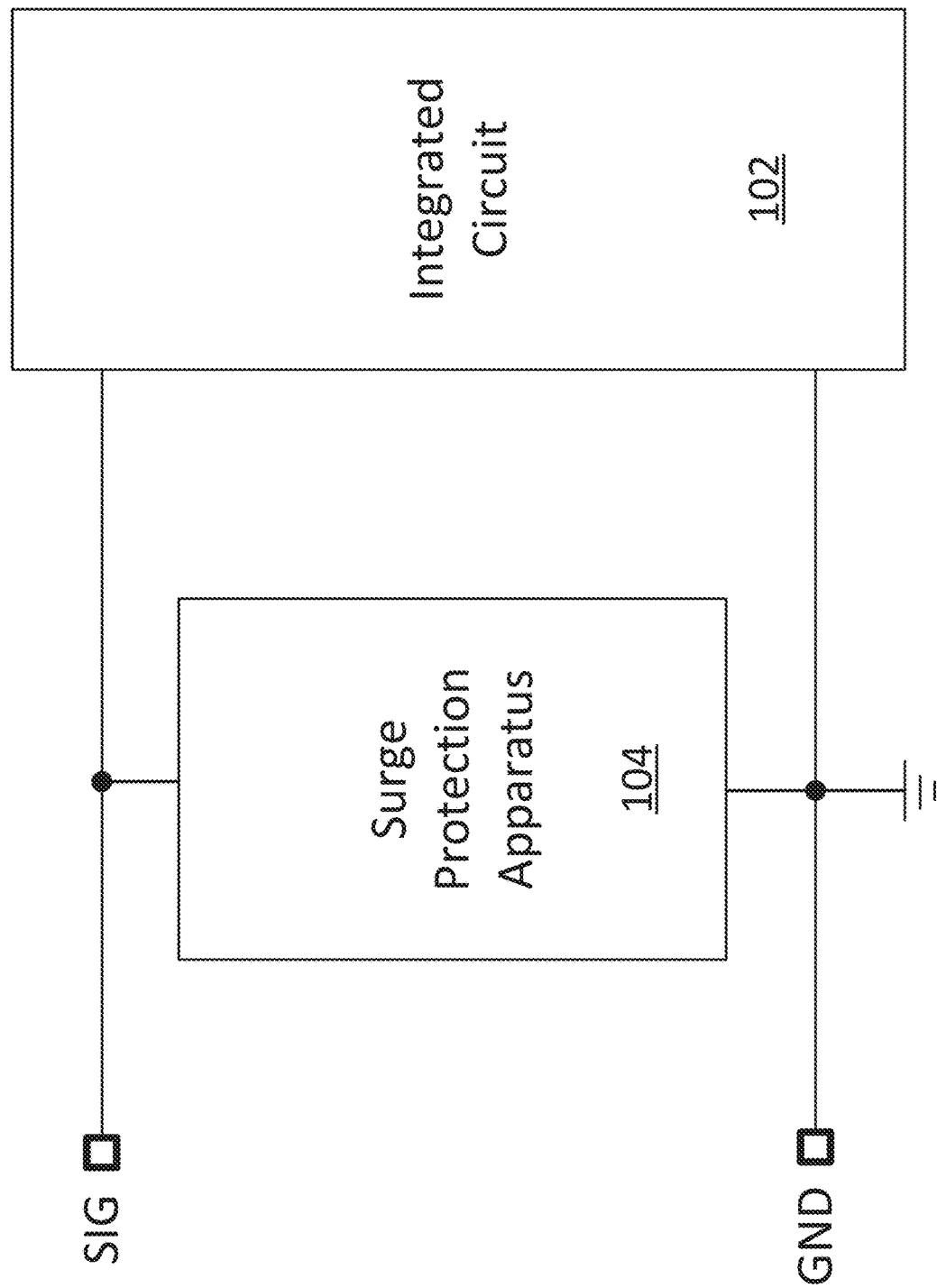
FIG. 4 illustrates a block diagram of an integrated circuit having a surge protection apparatus in accordance with various embodiments of the present disclosure.

FIG. 4 illustrates a block diagram of an integrated circuit having a surge protection apparatus in accordance with various embodiments of the present disclosure. An integrated circuit 102 has a SIG terminal and a GND terminal. In order to protect the integrated circuit from being damaged by voltage surges, a surge protection apparatus 104 is placed between the SIG terminal and the GND terminal.

The surge protection apparatus 104 comprises a first semiconductor element and a second semiconductor element connected in series between a first voltage terminal and a second voltage terminal. In some embodiments, the first semiconductor element is a first diode. The second semiconductor element is a second diode. The first voltage terminal is connected to a bias power supply. The second voltage terminal is connected to the GND terminal.

The surge protection apparatus 104 further comprises a switch and a clamping threshold circuit. The switch is connected between the first voltage terminal and the second voltage terminal. The clamping threshold circuit is connected between a common node of the first semiconductor element and the second semiconductor element, and a control terminal of the switch.

In operation, the clamping threshold circuit is configured such that the switch is turned on to protect the integrated circuit 102 once a voltage on the common node of the first semiconductor element and the second semiconductor element exceeds a predetermined threshold.

Figure 5:
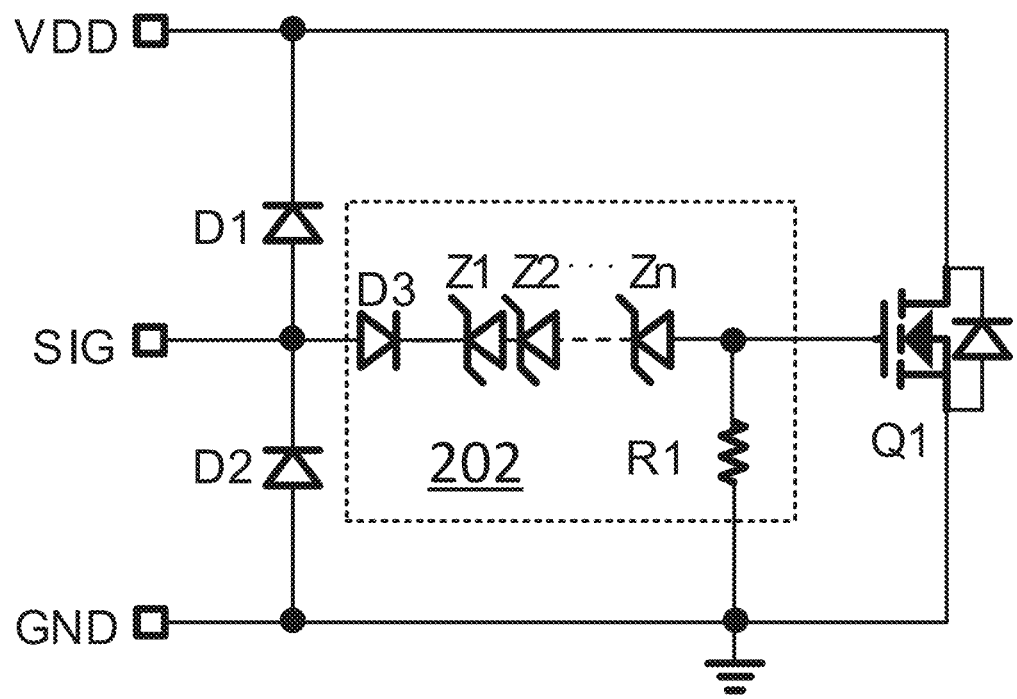
FIG. 5 illustrates a first implementation of the surge protection apparatus shown in FIG. 4 in accordance with various embodiments of the present disclosure.

FIG. 5 illustrates a first implementation of the surge protection apparatus shown in FIG. 4 in accordance with various embodiments of the present disclosure. The surge protection apparatus comprises two clamping diodes D1 and D2, a diode D3, a plurality of Zener diodes Z1, Z2, . . . , Zn, a resistor R1 and a switch Q1.

As shown in FIG. 5, a first diode D1 and a second diode D2 are connected in series between a first voltage terminal VDD and a second voltage terminal GND. The first voltage terminal VDD is connected to a bias power supply. Throughout the description, the first voltage terminal may be alternatively referred to as a VDD terminal. The second voltage terminal GND is connected to ground. Throughout the description, the second voltage terminal may be alternatively referred to as a GND terminal.

A switch Q1 is connected between the VDD terminal and the GND terminal. In some embodiments, the switch Q1 is an N-type MOSFET having a drain connected to the bias power supply and a source connected to ground.

A clamping threshold circuit 202 is connected between a common node of the first diode D1 and the second diode D2, and a gate of the switch Q1. The clamping threshold circuit 202 comprises a third diode D3, a resistor R1 and a plurality of Zener diodes Z1, Z2, . . . , Zn. The clamping threshold circuit 202 is configured such that in response to a voltage surge applied to the common node of the first diode D1 and the second diode D2, the switch Q1 is turned on once the voltage surge is greater than a predetermined threshold.

As shown in FIG. 5, the third diode D3 and the plurality of Zener diodes are connected in series between the common node of the first diode D1 and the second diode D2, and the gate of the switch Q1. The resistor R1 is connected between the gate of the switch Q1 and the GND terminal.

As shown in FIG. 5, an anode of the third diode D3 is connected to the common node of the first diode D1 and the second diode D2. A cathode of the third diode D3 is connected to the plurality of Zener diodes. A cathode of a first Zener diode (e.g., Z1) of the plurality of Zener diodes is connected to the cathode of the third diode D3. An anode of the first Zener diode (e.g., Z1) of the plurality of Zener diodes is connected to a cathode of an adjacent Zener diode (e.g., Z2). A cathode of a last Zener diode (e.g., Zn) of the plurality of Zener diodes is connected to an anode of an adjacent Zener diode. An anode of the last Zener diode (e.g., Zn) of the plurality of Zener diodes is connected to the gate of the switch Q1.

In accordance with an embodiment, the switch Q1 of FIG. 5 may be one or a plurality of MOSFET devices. Alternatively, the switch Q1 can be any controllable switches such as insulated gate bipolar transistor (IGBT) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, gallium nitride (GaN) based power devices, silicon carbide (SiC) based power devices and the like.

One advantageous feature of having the surge protection apparatus shown in FIG. 5 is that connecting D3 directly to the SIG terminal helps to improve the performance of the surge protection apparatus. More particularly, this configuration makes the turn-on threshold voltage of the switch Q1 not affected by the dynamic resistance of the clamping diode D1. The surge protection apparatus can more accurately control the clamping voltage on the SIG terminal. Furthermore, the surge protection apparatus is able to maintain high bandwidth characteristics at the SIG terminal.

In operation, when a surge occurs at the SIG terminal, the clamping threshold circuit 202 is triggered to turn on Q1 when the voltage on the SIG terminal reaches the predetermined clamping voltage threshold. In order to clamp the voltage on the SIG terminal, a current path is formed between the SIG terminal and ground. The current path comprises a first path comprising D3 and Z1~Zn and a second path that comprising D1 and Q1. Most of the current goes through the second path (flowing through D1 and Q1), and a very small part of the induced current flows through D3, Z1~Zn and R1. R1 is employed to provide the gate control voltage for the switch Q1. When the surge voltage on the SIG terminal is greater than the clamp threshold voltage, the current flowing through the first path increases, and Q1 is fully turned on. The fully tuned on Q1 limits the further increase of the voltage on the SIG terminal. As shown in FIG. 5, since the clamping threshold circuit 202 is directly connected to the SIG terminal that needs to be clamped, the voltage on the SIG terminal is not affected by the dynamic resistance of the diode D1 during the clamping process. At the same time, the first path (D3 and Z1~Zn) is cut off when the surge does not occur. The cut off of the first path isolates the parasitic capacitance from the SIG terminal, thereby not affecting the signal bandwidth on the SIG terminal.

Figure 6:
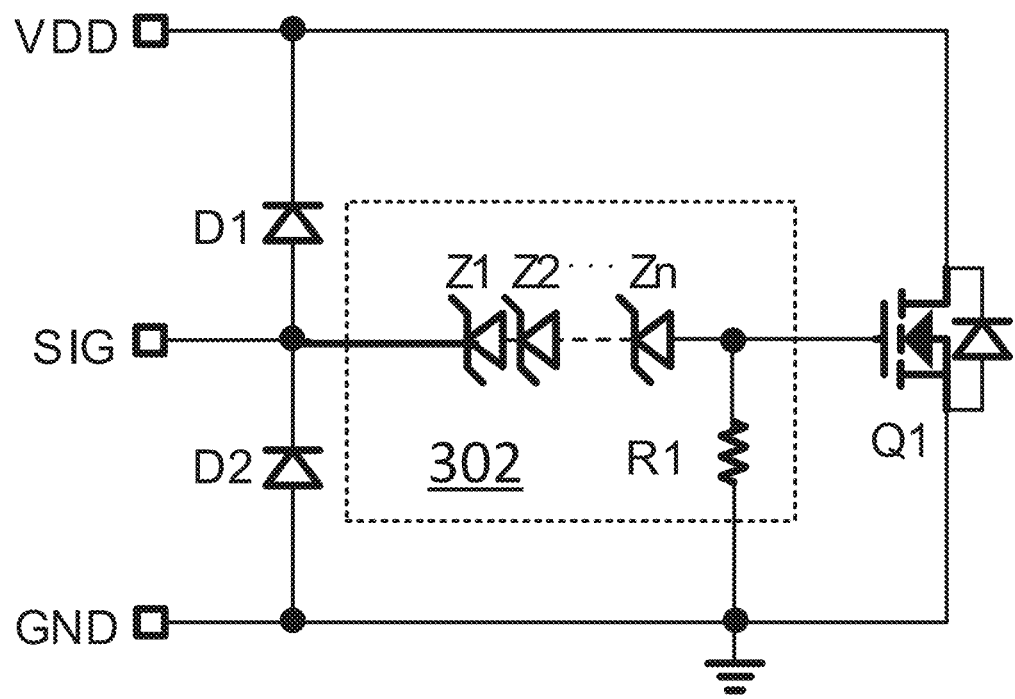
FIG. 6 illustrates a second implementation of the surge protection apparatus shown in FIG. 4 in accordance with various embodiments of the present disclosure.

FIG. 6 illustrates a second implementation of the surge protection apparatus shown in FIG. 4 in accordance with various embodiments of the present disclosure. The second implementation of the surge protection apparatus is similar to the first implementation of the surge protection apparatus shown in FIG. 5 except that the clamping threshold circuit 302 does not include D3. The plurality of Zener diodes is connected to the common node of the first diode D1 and the second diode D2 directly.

As shown in FIG. 6, a plurality of Zener diodes Z1~Zn is connected in series between the common node of the first diode D1 and the second diode D2, and the gate of the switch Q1. A resistor R1 is connected between the gate of the switch Q1 and the GND terminal. As shown in FIG. 6, a cathode of a first Zener diode (e.g., Z1) of the plurality of Zener diodes is connected to the common node of D1 and D2. An anode of the first Zener diode (e.g., Z1) of the plurality of Zener diodes is connected to a cathode of an adjacent Zener diode (e.g., Z2). A cathode of a last Zener diode (e.g., Zn) of the plurality of Zener diodes is connected to an anode of an adjacent Zener diode. An anode of the last Zener diode (e.g., Zn) of the plurality of Zener diodes is connected to the gate of the switch Q1. A resistor R1 is connected between the gate of the switch Q1 and the GND terminal. The operating principle of the clamping threshold circuit 302 is similar to the clamping threshold circuit 202 shown in FIG. 5, and hence is not discussed herein to avoid repetition.

Figure 7:
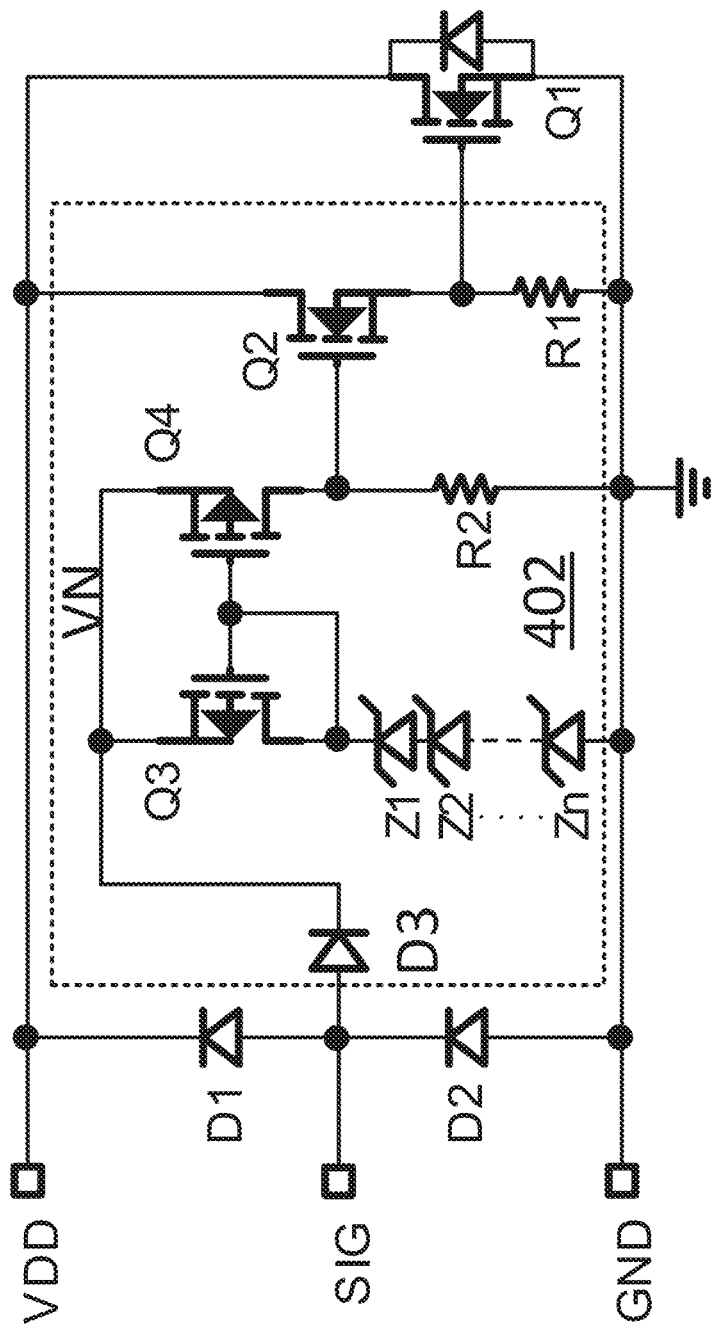
FIG. 7 illustrates a third implementation of the surge protection apparatus shown in FIG. 4 in accordance with various embodiments of the present disclosure.

FIG. 7 illustrates a third implementation of the surge protection apparatus shown in FIG. 4 in accordance with various embodiments of the present disclosure. The third implementation of the surge protection apparatus is similar to the first implementation of the surge protection apparatus shown in FIG. 5 except that the clamping threshold circuit 402 further comprises a current mirror and a gate drive circuit to improve the drive capability of the voltage clamping circuit.

The gate drive circuit comprises a first resistor R1, a second resistor R2 and a second switch Q2. The current mirror comprises a third switch Q3 and a fourth switch Q4. Q3 and Q4 are two PMOS transistors. As shown in FIG. 7, the second switch Q2 and the first resistor R1 are connected in series between the VDD terminal and the GND terminal. A common node of the second switch Q2 and the first resistor R1 is connected to the gate of the first switch Q1. The fourth switch Q4 and the second resistor R2 are connected in series between a voltage node VN and the GND terminal. A common node of the fourth switch Q4 and the second resistor R2 is connected to a gate of the second switch Q2. The third switch Q3 and the plurality of Zener diodes Z1~Zn are connected in series between the voltage node VN and the GND terminal. A gate of the third switch Q3 and a gate of the fourth switch Q4 are connected together and further connected to a common node of the third switch Q3 and the plurality of Zener diodes Z1~Zn. The third diode D3 is connected between the voltage node DN and the common node of the first diode D1 and the second diode D2. An anode of the third diode D3 is connected to the common node of the first diode D1 and the second diode D2, and a cathode of the third diode D3 is connected to the voltage node VN.

In operation, the current mirror helps to improve the response speed of the clamping circuit by increasing the gain and driving capability of the clamping circuit. When the voltage on the SIG terminal exceeds the clamping threshold voltage, Q3 is turned on, and the current flowing through Q3 is amplified by the current mirror. The increased current flows through R2 to generate the gate signal of Q2. Q2 is employed to provide strong driving capability. With the strong driving capability provided by Q2, the switch Q1 can be turned on faster to achieve a faster response and a more effective clamping.

It should be noted that the driving capability improvement circuit (the current mirror and the gate drive circuit) shown in FIG. 7 is applicable to all embodiments of the present disclosure.

Figure 1:
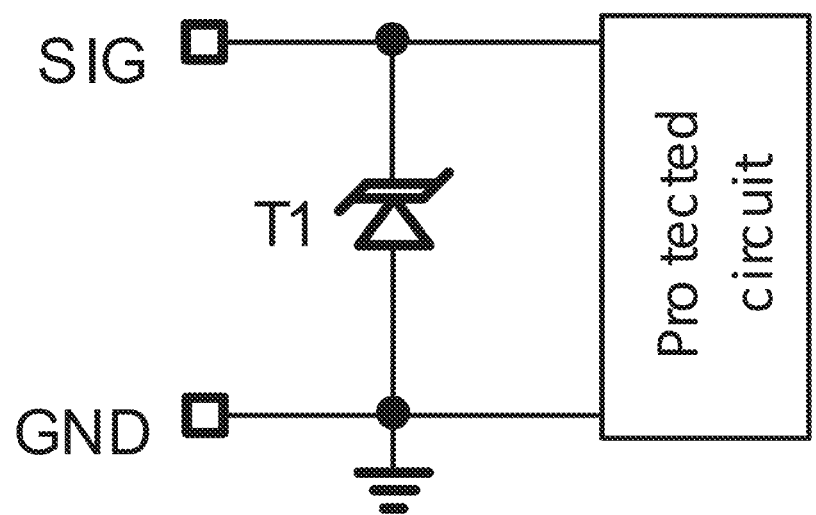
FIG. 1 illustrates a surge protection circuit.
Figure 2:
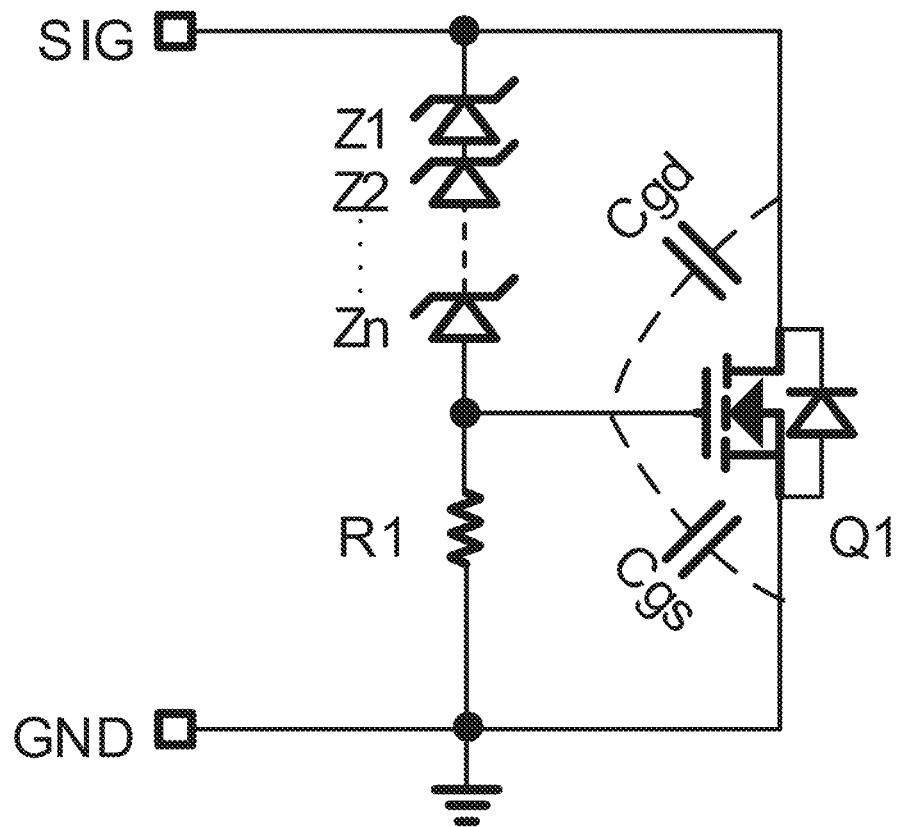
FIG. 2 illustrates an active surge protection circuit.
Figure 3:
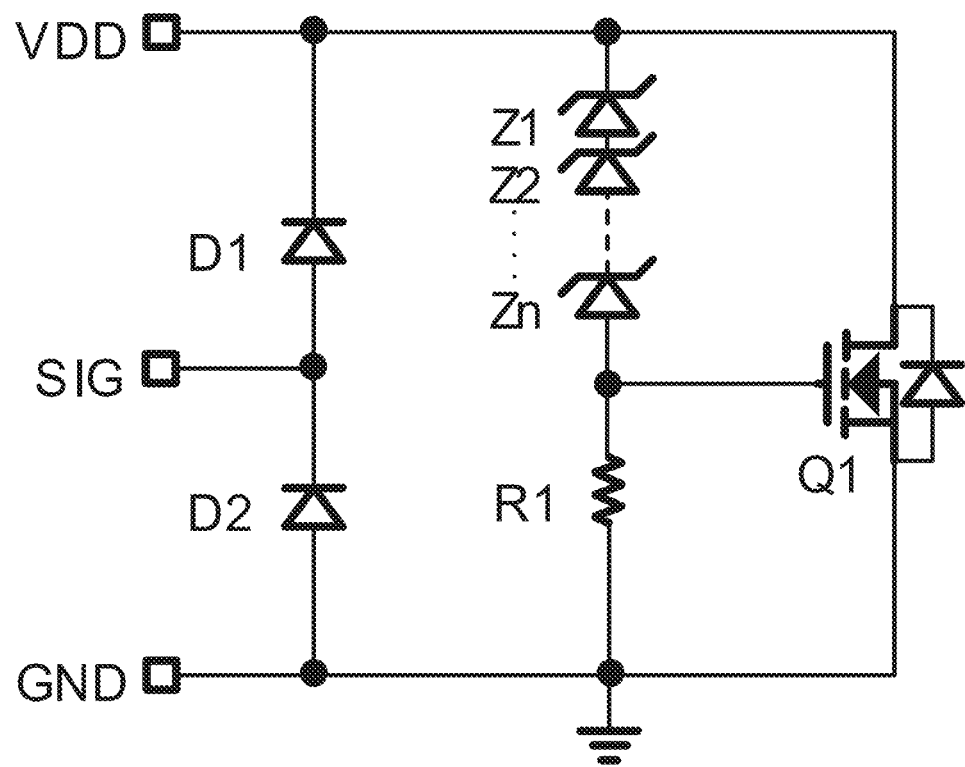
FIG. 3 illustrates another active surge protection circuit.
Figure 8:
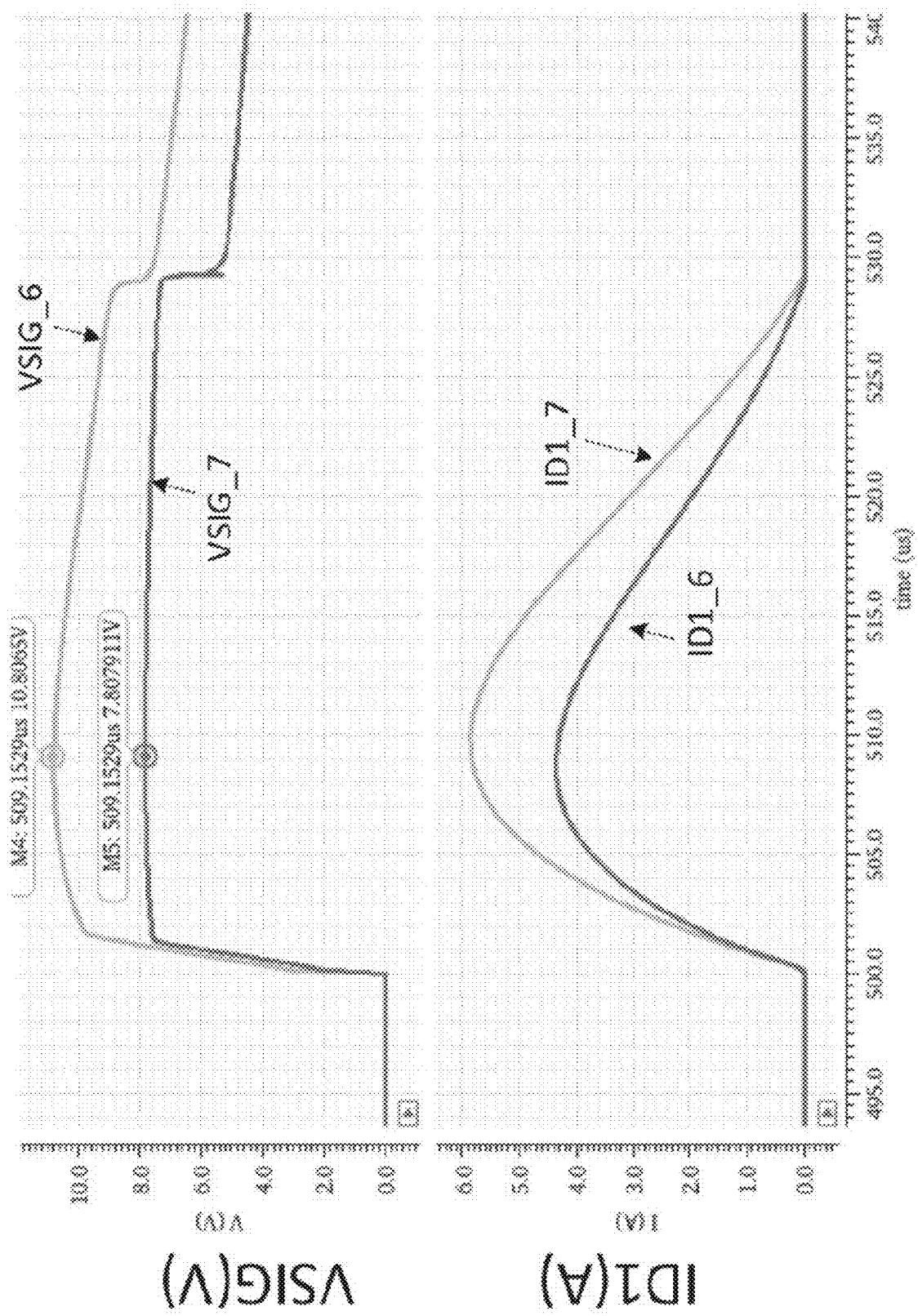
FIG. 8 illustrates a comparison between the surge protection circuit shown in FIG. 3 and the surge protection circuit shown in FIG. 5 in accordance with various embodiments of the present disclosure.

FIG. 8 illustrates a comparison between the surge protection circuit shown in FIG. 3 and the surge protection circuit shown in FIG. 5 in accordance with various embodiments of the present disclosure. The horizontal axis of FIG. 8 represents intervals of time. There may be two vertical axes. The first vertical axis VSIG represents the voltage on the SIG terminal. The curve associated with VSIG_6 represents the voltage on the SIG terminal of the surge protection circuit shown in FIG. 3. The curve associated with VSIG_7 represents the voltage on the SIG terminal of the surge protection circuit shown in FIG. 5. The second vertical axis ID1 represents the current flowing through the switch Q1. The curve associated with ID1_6 represents the current flowing through Q1 shown in FIG. 3. The curve associated with ID1_7 represents the current flowing through Q1 shown in FIG. 5.

In comparison with the surge protection circuit shown in FIG. 3, the clamping threshold circuit 202 shown in FIG. 5 can improve the clamping performance (e.g., the flatness of the clamping voltage curve). In response to the same voltage surge, the clamping threshold circuit 202 shown in FIG. 5 is triggered when the voltage on the SIG terminal reaches about 7.7 V. As the voltage surge increases, the current flowing through the switch Q1 also increases significantly to keep the voltage on the SIG terminal clamped at about 7.8 V as shown in FIG. 8. In contrast, the clamp circuit shown in FIG. 3 is triggered when the voltage across the clamping circuit reaches about 7.7 V. Due to the voltage dividing effect of the diode D1, the voltage on the SIG terminal that needs to be protected at this time has already exceeded 7.8 V. Then, as the current flowing through the diode D1 gradually increases, the voltage drop on D1 is also significantly increased due to the effect of the dynamic resistance of D1. The dynamic resistance of D1 limits the increase of the current flowing through D1 on the one hand, and on the other hand, the dynamic resistance of D1 makes the voltage on the SIG terminal continue to increase to its peak value equal to about 10.8 V as shown in FIG. 8. As such, the flatness of the clamp voltage of FIG. 5 is significantly better than that of the circuit in FIG. 3. FIG. 8 also shows the current flowing through Q1 in FIG. 5 is higher than the current flowing through Q1 in FIG. 3. In particular, the peak of the current flowing through Q1 in FIG. 5 is about 6 A. The peak of the current flowing through Q1 in FIG. 3 is about 4.5 A.

Figure 9:
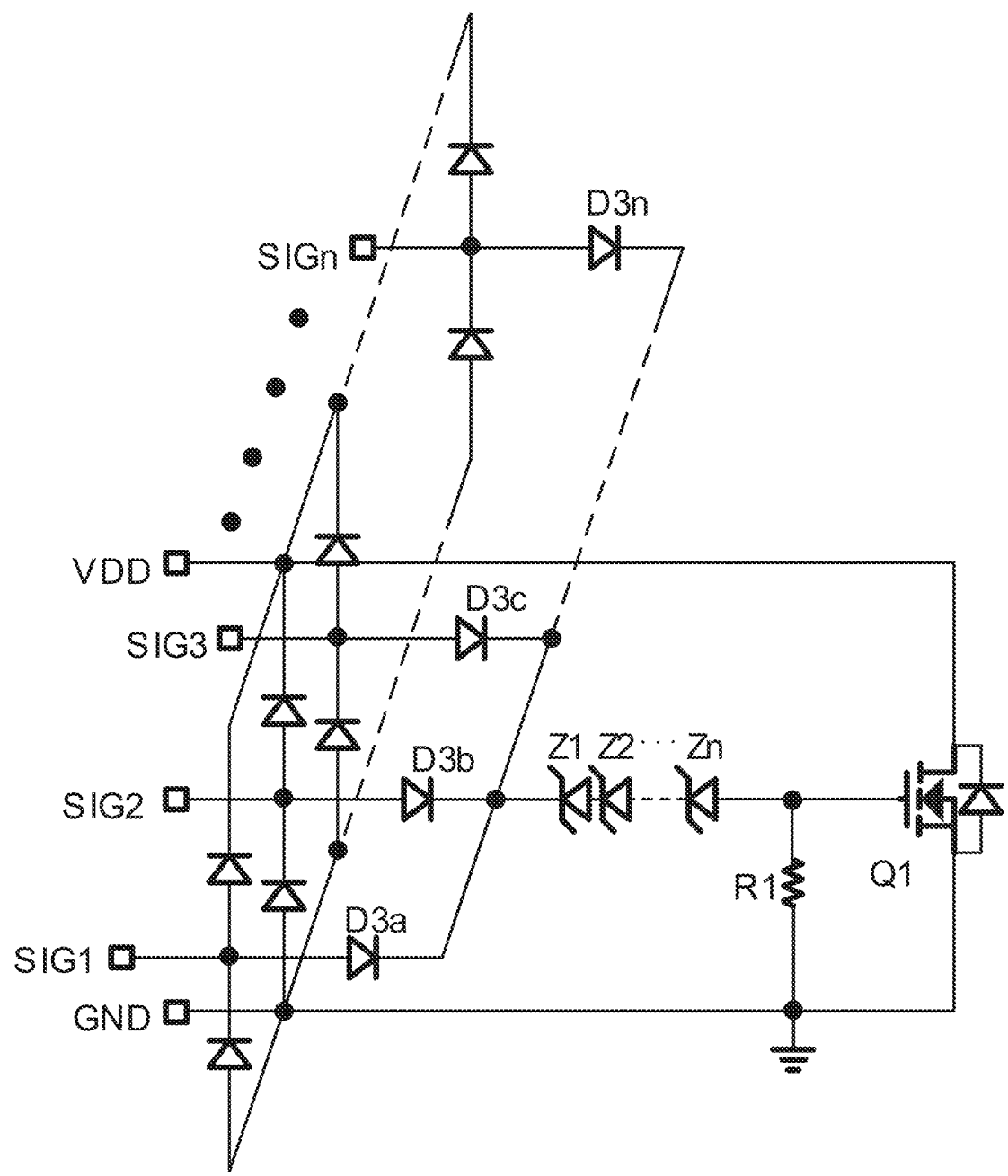
FIG. 9 illustrates a surge protection apparatus shared by a plurality of terminals in accordance with various embodiments of the present disclosure.

FIG. 9 illustrates a surge protection apparatus shared by a plurality of terminals in accordance with various embodiments of the present disclosure. As shown in FIG. 9, an integrated circuit has a plurality of terminals SIG1, SIG2, SIG3, . . . , SIGn to be protected. A plurality of diodes D3$a$, D3$b$, D3$c$, . . . , D3$n$, each of which has an anode connected to a corresponding terminal of the plurality of terminals. A surge protection apparatus comprises a plurality of Zener diodes Z1~Zn, a resistor R1 and a switch Q1. The surge protection apparatus is coupled between the VDD terminal and the GND terminal. As shown in FIG. 9, cathodes of the plurality of diodes D3$a$, D3$b$, D3$c$, . . . , D3$n$ are connected together and further connected to an input of the surge protection apparatus.

The surge protection apparatus shown in FIG. 9 is able to realize simultaneous protection of multiple signal terminals SIG1, SIG2, SIG3, . . . , SIGn. As shown in FIG. 9, when multiple signal terminals SIG1~SIGn in an integrated circuit or in a plurality of integrated circuits require surge protection at the same time, the surge protection apparatus shown in FIG. 9 is able to protect the signal terminals SIG1~SIGn from being damaged. For example, when a voltage surge occurs at any one of the multiple signal terminals, the surge protection apparatus can be activated to perform surge protection on the signal terminal. It should be noted that D3$a$~D3$n$ are employed to isolate the multiple signal terminals.

Figure 10:
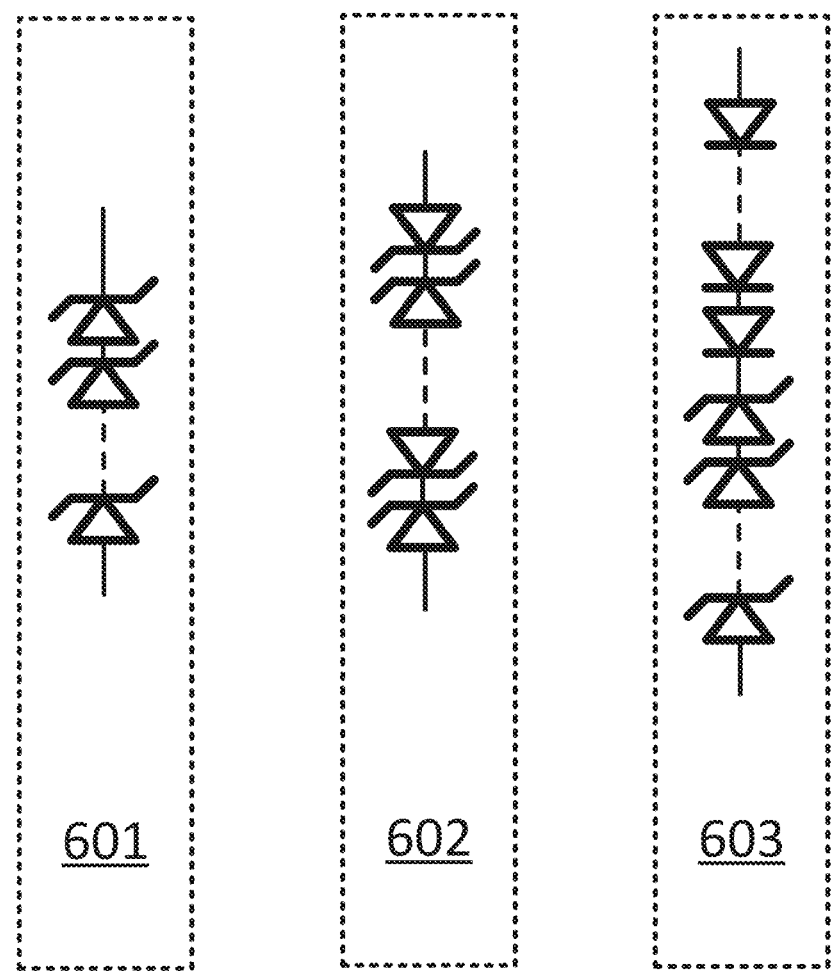
FIG. 10 illustrates a plurality of implementations of the clamping threshold circuit in accordance with various embodiments of the present disclosure.

FIG. 10 illustrates a plurality of implementations of the clamping threshold circuit in accordance with various embodiments of the present disclosure. In a first implementation 601, the clamping threshold circuit may comprise a plurality of Zener didoes. A cathode of a Zener diode is connected to an anode of an adjacent Zener diode. In a second implementation 602, the clamping threshold circuit may comprise a plurality of Zener didoes. At least two Zener diodes are back-to-back connected as shown in FIG. 10. The back-to-back connection of the Zener diodes is insensitive to temperature changes. As such, the second implementation of the clamping threshold circuit helps to improve the performance of the surge protection apparatus under various operating conditions. In a third implementation 603, the clamping threshold circuit may comprise a plurality of diodes and a plurality of Zener didoes. The specific combination of the diodes and Zener didoes is determined according to the required clamping threshold voltage value.

It should be noted that the plurality of implementations of the clamping threshold circuit shown in FIG. 10 is applicable to all embodiments of the present disclosure.

Figure 11:
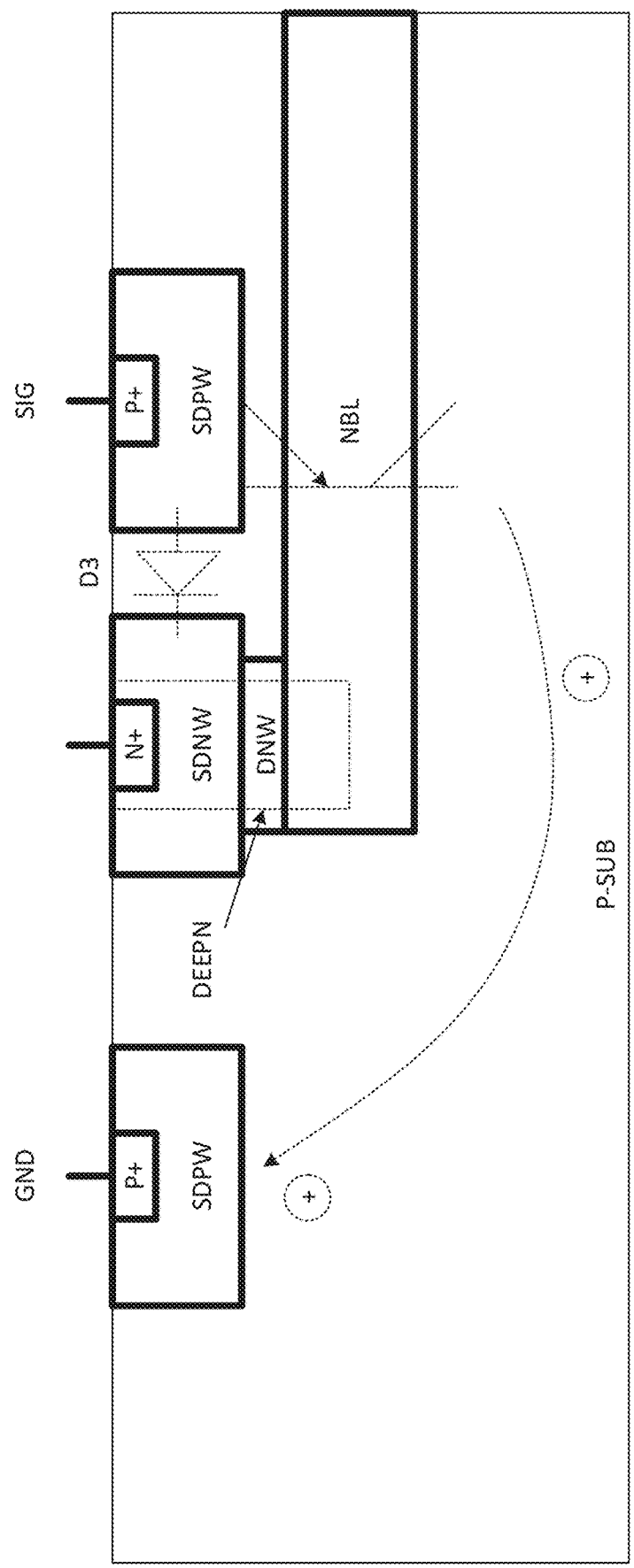
FIG. 11 illustrates a cross sectional view of a portion of the surge protection apparatus in accordance with various embodiments of the present disclosure.

FIG. 11 illustrates a cross sectional view of a portion of the surge protection apparatus in accordance with various embodiments of the present disclosure. As shown in FIG. 11, the diode D3 is formed over a p-type substrate (P-SUB). An N+ Buried Layer (NBL) is formed in the P-SUB. A first shallow well having P-type conductivity (SDPW on the right side), a shallow well having N-type conductivity (SDNW) and a second shallow well having P-type conductivity (SDPW on the left side) are also formed over the P-SUB. A first P+ region is formed in the first SDPW. An N+ region is formed in the SDNW. A second P+ region is formed in the second SDPW. For surge protection applications, the first P+ region is coupled to the SIG terminal. The second P+ region is coupled to the GND terminal.

As shown in FIG. 11, the third diode D3 of the surge protection apparatus is formed between the first SDPW and the SDNW. A parasitic P-type transistor is formed by the first SDPW, the NBL and the P-SUB.

In operation, when the third diode D3 is turned on, a sufficiently high number of holes may pass through the parasitic P-type transistor. In particular, the sufficiently high number of holes may be injected into the substrate. The holes injected into the substrate effectively divert some current flowing through D3. The reduced current flowing through D3 makes it harder to turn on the clamp threshold circuit. Furthermore, the holes injected into the substrate may cause the latch-up effect. In order to prevent the holes from passing through the parasitic P-type transistor, a P-type guard ring (SDPW) may be used to collect the holes to be injected into the substrate. Furthermore, as shown in FIG. 11, a deep N-type well (DEEPN) is formed adjacent to the cathode of D3 to reduce the gain of the parasitic P-type transistor, thereby reducing the number of holes injected into the substrate.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first diode and a second diode connected in series between a first voltage terminal and a second voltage terminal;
   a switch connected between the first voltage terminal and the second voltage terminal; and
   a clamping threshold circuit connected between a common node of the first diode and the second diode, and a gate of the switch, wherein the clamping threshold circuit comprises a third diode, a current mirror and a plurality of Zener diodes connected in series, and a gate drive circuit coupled between the current mirror and the gate of the switch, and wherein the clamping threshold circuit is configured such that in response to a voltage surge applied to the common node of the first diode and the second diode, the switch is turned on once the voltage surge is greater than a predetermined threshold.

2. The apparatus of claim 1, wherein:
   the first voltage terminal is connected to a bias power supply; and
   the second voltage terminal is connected to ground.

3. The apparatus of claim 2, wherein:
   the switch is an N-type MOSFET having a drain connected to the bias power supply and a source connected to ground.

4. The apparatus of claim 1, wherein the gate drive circuit comprises:
   a resistor connected between the gate of the switch and the second voltage terminal.

5. The apparatus of claim 4, wherein:
   an anode of the third diode is connected to the common node of the first diode and the second diode; and
   a cathode of the third diode is coupled to the plurality of Zener diodes.

6. The apparatus of claim 4, wherein:
   a cathode of a first Zener diode of the plurality of Zener diodes is connected to the cathode of the third diode through the current mirror;
   an anode of the first Zener diode of the plurality of Zener diodes is connected to a cathode of an adjacent Zener diode;
   a cathode of a last Zener diode of the plurality of Zener diodes is connected to an anode of an adjacent Zener diode; and
   an anode of the last Zener diode of the plurality of Zener diodes is connected to the second voltage terminal.

7. A device comprising:
   a first semiconductor element and a second semiconductor element connected in series between a first voltage terminal and a second voltage terminal;
   a first switch connected between the first voltage terminal and the second voltage terminal; and
   a clamping threshold circuit connected between a common node of the first semiconductor element and the second semiconductor element, and a control terminal of the first switch, wherein the clamping threshold circuit is configured such that the first switch is turned on once a voltage on the common node of the first semiconductor element and the second semiconductor element exceeds a predetermined threshold, and wherein the first semiconductor element is a first diode, the second semiconductor element is a second diode, and the control terminal of the first switch is a gate of the first switch, and wherein the clamping threshold circuit comprises:
- a third diode, a current mirror and a plurality of Zener diodes connected in series; and
- a gate drive circuit coupled between the current mirror and the gate of the first switch.

8. The device of claim 7, wherein:
a cathode of the first diode is connected to the first voltage terminal;
an anode of the first diode is connected to a cathode of the second diode; and
an anode of the second diode is connected to the second voltage terminal.

9. The device of claim 7, wherein the clamping threshold circuit comprises:
the third diode, the current mirror and the plurality of Zener diodes connected in series between a common node of the first diode and the second diode, and the second voltage terminal, and wherein:
- an anode of the third diode is connected to the common node of the first diode and the second diode;
- a cathode of the third diode is connected to the plurality of Zener diodes through the current mirror;
- a cathode of a first Zener diode of the plurality of Zener diodes is connected to the cathode of the third diode through the current mirror;
- an anode of the first Zener diode of the plurality of Zener diodes is connected to a cathode of an adjacent Zener diode;
- a cathode of a last Zener diode of the plurality of Zener diodes is connected to an anode of an adjacent Zener diode; and
- an anode of the last Zener diode of the plurality of Zener diodes is connected to the second voltage terminal; and
a resistor connected between the gate of the first switch and the second voltage terminal.

10. The device of claim 7, wherein:
the gate drive circuit comprises a first resistor, a second resistor and a second switch; and
the current mirror comprises a third switch and a fourth switch.

11. The device of claim 10, wherein:
the second switch and the first resistor are connected in series between the first voltage terminal and the second voltage terminal, and wherein a common node of the second switch and the first resistor is connected to the gate of the first switch;
the fourth switch and the second resistor are connected in series between a voltage node and the second voltage terminal, and wherein a common node of the fourth switch and the second resistor is connected to a gate of the second switch;
the third switch and the plurality of Zener diodes are connected in series between the voltage node and the second voltage terminal, and wherein a gate of the third switch and a gate of the fourth switch are connected together and further connected to a common node of the third switch and the plurality of Zener diodes; and
the third diode is connected between the voltage node, and the common node of the first diode and the second diode, and wherein an anode of the third diode is connected to the common node of the first diode and the second diode, and a cathode of the third diode is connected to the voltage node.

12. The device of claim 7, wherein:
the first switch is an N-type MOSFET.

13. A system comprising:
an integrated circuit having a plurality of terminals to be protected;
a plurality of diodes, each of which has an anode connected to a corresponding terminal of the plurality of terminals to be protected; and
a surge protection apparatus coupled between a first voltage terminal and a second voltage terminal, wherein cathodes of the plurality of diodes are connected together and further connected to an input of the surge protection apparatus, and wherein the surge protection apparatus comprises a current mirror and a plurality of Zener diodes connected in series, and a gate drive circuit coupled between the current mirror and a gate of a switch connected between the first voltage terminal and the second voltage terminal.

14. The system of claim 13, further comprising:
a plurality of first diodes and a plurality of second diodes connected in series between the first voltage terminal and the second voltage terminal, wherein a common node of a first diode and a corresponding second diode is connected to one diode of the plurality of diodes and one terminal of the plurality of terminals to be protected.

15. The system of claim 13, wherein the surge protection apparatus further comprises:
the switch connected between the first voltage terminal and the second voltage terminal.

16. The system of claim 15, wherein:
the surge protection apparatus is configured such that the switch is turned on once a voltage on one terminal of the plurality of terminals exceeds a predetermined threshold.

* * * * *